(12) United States Patent
Wang et al.

(10) Patent No.: US 9,780,333 B1
(45) Date of Patent: Oct. 3, 2017

(54) ORGANIC LIGHT-EMITTING DIODE ELEMENT AND DISPLAY DEVICE

(71) Applicants: BOE Technology Group Co., Ltd., Beijing (CN); HEFEI Xinsheng Optoelectronics Technology Co., Ltd., Hefei (CN)

(72) Inventors: Xinxin Wang, Beijing (CN); Minghung Hsu, Beijing (CN); Wenbin Jia, Beijing (CN); Rui Peng, Beijing (CN); Zhijie Ye, Beijing (CN); Yue Hu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/261,373

(22) Filed: Sep. 9, 2016

(30) Foreign Application Priority Data

Mar. 25, 2016 (CN) .......................... 2016 1 0179872

(51) Int. Cl.
H01L 51/52 (2006.01)

(52) U.S. Cl.
CPC ...... H01L 51/5253 (2013.01); H01L 51/5271 (2013.01); *H01L 51/5206* (2013.01); *H01L 51/5221* (2013.01); *H01L 51/5234* (2013.01)

(58) Field of Classification Search
CPC ............. H01L 51/5206; H01L 51/5221; H01L 51/5234; H01L 51/5253; H01L 51/5271
See application file for complete search history.

(56) References Cited

U.S. PATENT DOCUMENTS

| | | | | |
|---|---|---|---|---|
| 9,166,184 | B2* | 10/2015 | Yang | H01L 51/5004 |
| 2004/0085019 | A1* | 5/2004 | Su | H01L 51/529 313/506 |
| 2012/0256528 | A1* | 10/2012 | Baisl | B82Y 10/00 313/46 |
| 2012/0326599 | A1 | 12/2012 | Yamada et al. | |
| 2014/0070190 | A1* | 3/2014 | Chen | H01L 27/3225 257/40 |
| 2014/0374726 | A1* | 12/2014 | Goeoetz | H01L 51/529 257/40 |
| 2015/0021544 | A1* | 1/2015 | Huang | H01L 33/02 257/13 |
| 2016/0020429 | A1* | 1/2016 | Kuroki | H01L 51/5268 257/40 |

FOREIGN PATENT DOCUMENTS

| | | |
|---|---|---|
| CN | 1838426 A | 9/2006 |
| JP | 2007317451 A | 12/2007 |

OTHER PUBLICATIONS

Apr. 6, 2017—(CN) First Office Action Appn 201610179872.8 with English Tran.

\* cited by examiner

*Primary Examiner* — Nicholas Tobergte
(74) *Attorney, Agent, or Firm* — Banner & Witcoff, Ltd.

(57) ABSTRACT

An organic light-emitting diode (OLED) element and a display device are provided. The OLED element includes a base substrate and an anode, an organic functional layer and a cathode sequentially stacked on the base substrate. A thermal expansion layer is disposed on at least one of a side of the anode away from the organic functional layer or a side of the cathode away from the organic functional layer and is a transparent thermal expansion layer.

20 Claims, 2 Drawing Sheets

US 9,780,333 B1

ORGANIC LIGHT-EMITTING DIODE ELEMENT AND DISPLAY DEVICE

This application claims priority to and the benefit of Chinese Patent Application No. 201610179872.8 filed on Mar. 25, 2016, which application is incorporated herein in its entirety.

TECHNICAL FIELD

The present invention relates to an organic light-emitting diode (OLED) element and a display device.

BACKGROUND

Organic electroluminescent element, also referred to as OLED element, receives much concern due to the advantages of self-illumination, rich color, rapid response speed, wide viewing angle, light weight, low thickness, low power consumption, capability of achieving flexible display, etc. Moreover, display devices manufactured by the OLED elements are considered as display devices with significant application prospect.

The basic structure of the OLED element is a sandwich structure formed by an anode, a cathode and an organic functional layer disposed between the anode and the cathode, wherein the organic functional layer generally includes a hole transport layer (HTL), an emission layer (EML), an electron transport layer (ETL), etc. When voltage is applied to the OLED element, holes outputted from the anode and electrons outputted from the cathode are combined in the organic functional layer, so that the organic functional layer can emit light and the light emitted by the organic functional layer is emitted out of the OLED element through the anode or the cathode.

However, after the conventional OLED element is manufactured, the thickness of layers of the OLED element is unchanged, so the optical cavity length of the OLED element is nonadjustable and the wavelength of light emitted by the OLED element is unchanged, namely the light color of the OLED element is also nonadjustable, and hence the display effect of the display device can be poor.

SUMMARY

One aspect of the disclosure provides an organic light-emitting diode (OLED) element, comprising a base substrate and an anode, an organic functional layer and a cathode sequentially stacked on the base substrate, wherein a thermal expansion layer is disposed on at least one of a side of the anode away from the organic functional layer or a side of the cathode away from the organic functional layer and is a transparent thermal expansion layer.

Based on the technical solution of OLED element as mentioned above, a second aspect of the disclosure provides a display device comprising the OLED element as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
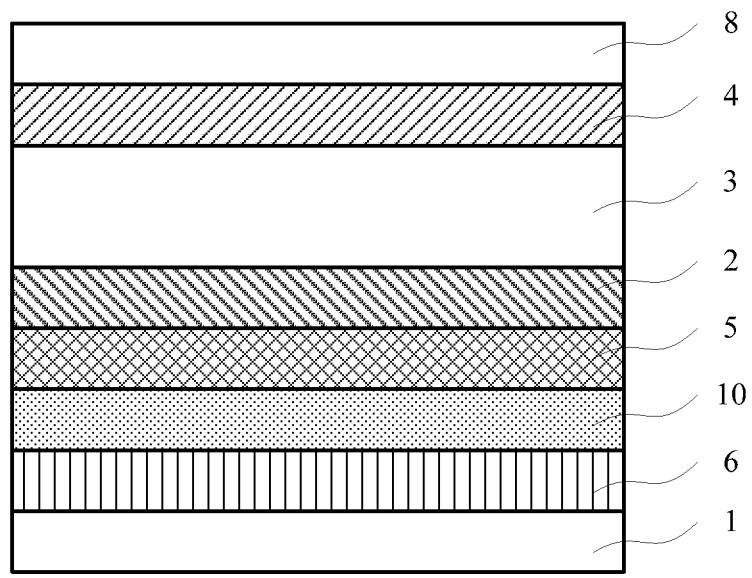
FIG. 1 is a schematic structural view 1 of an OLED element provided by the embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

As illustrated in FIGS. 1 to 4, the OLED element provided by the embodiment of the present invention comprises a base substrate 1 and an anode 2, an organic functional layer 3 and a cathode 4 sequentially stacked on the base substrate 1. A thermal expansion layer 5 is disposed on a side of the anode 2 away from the organic functional layer 3, and/or, a thermal expansion layer 5 is disposed on a side of the cathode 4 away from the organic functional layer 3. The thermal expansion layer 5 is a transparent thermal expansion layer.

It should be noted that the OLED element may generally be divided into top-emission OLED element and bottom-emission OLED element according to different emission directions of light from the OLED element. In the top-emission OLED element, light emitted by the organic functional layer 3 is emitted from the direction away from the base substrate 1, namely the light emitted by the organic functional layer 3 is emitted from the top of the OLED element. That is to say, the light emitted by the organic functional layer 3 is emitted from the top of FIG. 1, 2 or 3. In the bottom-emission OLED element, light emitted by the organic functional layer 3 is emitted from the base substrate 1, namely the light emitted by the organic functional layer 3 is emitted from the bottom of the OLED element. That is to say, the light emitted by the organic functional layer 3 is emitted from the bottom of FIG. 4. The thermal expansion layer 5 may be specifically set according to different types of OLED elements.

In some examples, the OLED element provided by the embodiment of the present invention comprises a base substrate 1 and an anode 2, an organic functional layer 3 and a cathode 4 sequentially stacked on the base substrate 1. The anode 2 may adopt an indium tin oxide (ITO) anode; the cathode 4 may adopt a metal cathode; and the organic functional layer 3 generally includes a hole transport layer (HTL), an electro-luminescence layer (EML) and an electron transport layer (ETL) which are sequentially stacked. The HTL makes contact with the anode 2, and the ETL makes contact with the cathode 4. The position of a transparent thermal expansion layer 5 may be specifically set according to different types of OLED elements. For instance, in the top-emission OLED element, the thermal expansion layer 5 may be disposed beneath the anode 2 in FIG. 1, or the thermal expansion layer 5 may be disposed on the cathode 4 in FIG. 2, or the thermal expansion layer 5 may be respectively disposed beneath the anode 2 and on the cathode 4 in FIG. 3. In the bottom-emission OLED element, the thermal expansion layer 5 may be disposed beneath the anode 2 in FIG. 4.

When the OLED element works, the thermal expansion layer 5 absorbs heat produced when the organic functional layer 3 emits light, and/or, the thermal expansion layer 5 absorbs heat applied to the thermal expansion layer 5 by external world, so that the temperature of the thermal expansion layer 5 is changed, and hence the thickness of the thermal expansion layer 5 is changed. When light emitted by the organic functional layer 3 is incident into the thermal expansion layer 5 and runs through the thermal expansion layer 5, as the thickness of the thermal expansion layer 5 is changed, the time of the light emitted by the organic functional layer 3 running through the thermal expansion layer 5 can be adjusted, and the wavelength of the light emitted by the organic functional layer 5 after running through the thermal expansion layer 5 can be adjusted, and hence the wavelength of light emitted by the OLED element can be adjusted. Thus, the light color of the OLED element can be adjusted, so that the light color of OLED elements in a display device is matched with each other, and hence the display effect of the OLED element can be improved.

In the embodiment, the thermal expansion layer 5 may be specifically set according to different types of OLED elements. Exemplary description will be given below to the setting means of the thermal expansion layer 5 in different types of OLED elements.

In the top-emission OLED element, the setting modes of the thermal expansion layer 5 may include but not limited to the following three means.

First mode: as illustrated in FIG. 1, the thermal expansion layer 5 is disposed between the anode 2 and the base substrate 1 and makes contact with the anode 2. For example, the OLED element comprises a base substrate 1, an anode 2, an organic functional layer 3, a cathode 4 and a thermal expansion layer 5, wherein the thermal expansion layer 5, the anode 2, the organic functional layer 3 and the cathode 4 are sequentially stacked on the base substrate 1; the thermal expansion layer 5 makes contact with the anode 2; and the cathode 4 is a semitransparent metal cathode. When the OLED element works, a part of light emitted by the organic functional layer 3 is directly emitted out of the OLED element from the top in FIG. 1 through the cathode 4, and the other part is incident into the thermal expansion layer 5 through the anode 2. At this point, heat produced by the organic functional layer 3 is conducted to the thermal expansion layer 5 through the anode 2, and/or, the thermal expansion layer 5 absorbs heat applied to the thermal expansion layer 5 by external world, so that the temperature of the thermal expansion layer 5 is changed, and hence the thickness of the thermal expansion layer 5 is also changed. Thus, the time of the light incident into the thermal expansion layer 5 running through the thermal expansion layer 5 is also changed, and hence the wavelength of the light emitted from the bottom of the thermal expansion layer 5 in FIG. 1 is adjusted. The light emitted from the bottom of the thermal expansion layer 5 in FIG. 1 is reflected on the base substrate 1 or reflecting materials on the base substrate 1 and runs through the thermal expansion layer 5 again, namely the wavelength of this part of light is adjusted again. The light running through the thermal expansion layer 5 sequentially runs through the organic functional layer 3 and the cathode 4 and is emitted out of the OLED element.

The thermal expansion layer 5 makes contact with the anode 2. This case can accelerate the transmission speed of heat produced by the organic functional layer 3, so as to rapidly adjust the temperature of the thermal expansion layer 5 and rapidly adjust the thickness of the thermal expansion layer 5, accelerate the response speed of adjusting the wavelength of the light emitted by the OLED element, and hence reduce the response time of adjusting the wavelength of the light emitted by the OLED element.

In the first mode, in order to allow light running through the anode 2 to be emitted out of the OLED element from the top of the OLED element and improve the utilization rate of the light emitted by the organic functional layer 3, the base substrate 1 may be set to be a nontransparent base substrate; a part of light emitted by the organic functional layer 3 sequentially runs through the anode 2 and the thermal expansion layer 5, is reflected on the base substrate 1, subsequently sequentially runs through the thermal expansion layer 5, the anode 2, the organic functional layer 3 and the cathode 4, and is emitted out of the OLED element; or a layer of reflecting material is disposed between the base substrate 1 and the thermal expansion layer 5, and a part of light emitted by the organic functional layer 3 sequentially runs through the anode 2 and the thermal expansion layer 5, is reflected on the reflecting material, subsequently sequentially runs through the thermal expansion layer 5, the anode 2, the organic functional layer 3 and the cathode 4, and is emitted out of the OLED element. Thus, the light running through the anode 2 can be emitted out of the OLED element from the top of the OLED element, so that the utilization rate of the light emitted by the organic functional layer 3 can be improved.

In the embodiment of the present invention, as illustrated in FIG. 1, the light running through the anode 2 is emitted out of the OLED element from the top of the OLED element by forming a layer of reflecting material on the base substrate 1. For instance, as illustrated in FIG. 1, the OLED element further comprises a reflective layer 6 disposed between the anode 2 and the base substrate 1; and the thermal expansion layer 5 is disposed between the reflective layer 6 and the anode 2. That is to say, the OLED element comprises: a base substrate 1 and a reflective layer 6, a thermal expansion layer 5, an anode 2, an organic functional layer 3 and a cathode 4 which are sequentially stacked on the base substrate 1. The thermal expansion layer 5 makes contact with the anode 2. Due to the setting of the reflective layer 6, the light sequentially running through the anode 2 and the thermal expansion layer 5 is reflected and subsequently sequentially runs through the thermal expansion layer 5, the anode 2, the organic functional layer 3 and the cathode 4. Thus, the utilization rate of the light emitted by the organic functional layer 3 can be improved.

In the top-emission OLED element, the cathode 4 is generally a semitransparent metal cathode and has low thickness. Thus, in order to prevent the cathode 4 from being damaged, as illustrated in FIG. 1, the OLED element further comprises a transparent protective layer 8 which is disposed on the cathode 4. For instance, the OLED element comprises: a base substrate 1 and a reflective layer 6, a thermal expansion layer 5, an anode 2, an organic functional layer 3, a cathode 4 and a transparent protective layer 8 which are sequentially stacked on the base substrate 1, wherein the thermal expansion layer 5 makes contact with the anode 2, and the transparent protective layer 8 is disposed on the cathode 4 and makes contact with the cathode 4. Due to the setting of the transparent protective layer 8, the cathode 4 may be isolated from the external world, so that the transparent protective layer can have the function of protecting the cathode 4 and prevent the cathode 4 from being damaged.

In addition, when the light emitted by the organic functional layer 3 is emitted out of the OLED element through the cathode 4, as the refractive index of the cathode 4 is greater than that of the air, when the light is incident into the air from the cathode 4, the light tends to be totally reflected on an interface of the cathode 4 and the air. Therefore, in order to reduce the degree of total reflection of the light on the interface of the cathode 4 and the air, the transparent protective layer 8 of which the refractive index is between the refractive index of the cathode 4 and the refractive index of the air may be selected, so that the degree of total reflection of the light on the interface of the cathode 4 and the air can be reduced, and hence the light extraction can be improved.

Figure 2:
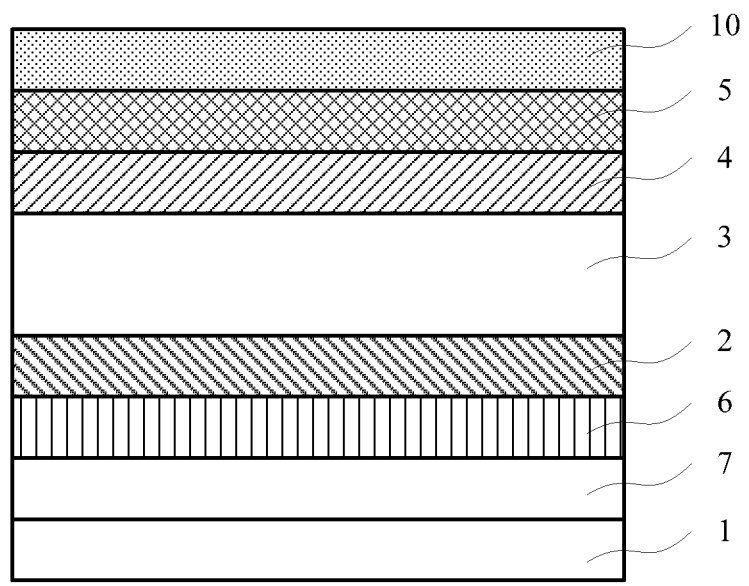
FIG. 2 is a schematic structural view 2 of the OLED element provided by the embodiment of the present invention.

Second mode: as illustrated in FIG. 2, the thermal expansion layer 5 is disposed on a side of the cathode 4 away from the organic functional layer 3 and makes contact with the cathode 4. For example, the OLED element comprises a base substrate 1, an anode 2, an organic functional layer 3, a cathode 4 and a thermal expansion layer 5, wherein the anode 2, the organic functional layer 3, the cathode 4 and the thermal expansion layer 5 are sequentially stacked on the base substrate 1; the thermal expansion layer 5 makes contact with the cathode 4; and the cathode 4 is a semi-transparent metal cathode. When the OLED element works, a part of light emitted by the organic functional layer 3 is incident into the thermal expansion layer 5 through the cathode 4 and emitted out of the OLED element through the thermal expansion layer 5, and the other part of light runs through the anode 2, is reflected on the base substrate 1 or reflecting materials on the base substrate 1, subsequently sequentially runs through the anode 2, the organic functional layer 3 and the cathode 4, is incident into the thermal expansion layer 5, and is emitted out of the OLED element through the thermal expansion layer 5. When the OLED element works, heat produced by the organic functional layer 3 is conducted to the thermal expansion layer 5 through the cathode 4, and/or, the thermal expansion layer 5 absorbs heat applied to the thermal expansion layer 5 by external world, so that the temperature of the thermal expansion layer 5 is changed and the thickness of the thermal expansion layer 5 is also changed, and hence the time of the light emitted by the organic functional layer 3 running through the thermal expansion layer 5 is changed. Thus, after the light emitted by the organic functional layer 3 runs through the thermal expansion layer 5, the wavelength is adjusted, namely the wavelength of the light emitted by the OLED element is adjusted, and hence the light color of the OLED element is adjusted.

The thermal expansion layer 5 makes contact with the cathode 4. The case can accelerate the transmission speed of the heat produced by the organic functional layer 3, so as to rapidly adjust the temperature of the thermal expansion layer 5 and rapidly adjust the thickness of the thermal expansion layer 5, accelerate the response speed of adjusting the wavelength of the light emitted by the OLED element, and hence reduce the response time of adjusting the wavelength of the light emitted by the OLED element. In addition, the thermal expansion layer 5 is disposed on the cathode 4 and may isolate the cathode 4 from the external world and prevent the cathode 4 from being damaged.

As illustrated in FIG. 2, the OLED element further comprises a reflective layer 6 and a transition layer 7. The reflective layer 6 is disposed between the anode 2 and the base substrate 1. The transition layer 7 is disposed between the reflective layer 6 and the base substrate 1 and respectively makes contact with the reflective layer 6 and the base substrate 1. For instance, the OLED element comprises: a base substrate 1 and a transition layer 7, a reflective layer 6, an anode 2, an organic functional layer 3, a cathode 4 and a thermal expansion layer 5 which are sequentially stacked on the base substrate 1, wherein the transition layer 7 respectively makes contact with the base substrate 1 and the reflective layer 6, and the thermal expansion layer 5 makes contact with the cathode 4. Due to the setting of the reflective layer 6, the light emitted by the organic functional layer 3 is reflected to the top of the OLED element, so that the utilization rate of the light emitted by the organic functional layer 3 can be improved. Due to the setting of the transition layer 7, a gap formed between the reflective layer 6 and the base substrate 1 due to small bonding force between the reflective layer 6 and the base substrate 1 can be avoided, namely the transition layer 7 has the function of transition. In addition, due to the setting of the transition layer 7, light running through the reflective layer 6 may also be reflected to the top of the OLED element, so that the utilization rate of the light emitted by the organic functional layer 3 can be further improved. The reflective layer 6 may be a metal reflective layer, e.g., an aluminum reflective layer or an aluminum alloy reflective layer, and the transition layer 7 may also be a metal transition layer.

Figure 3:
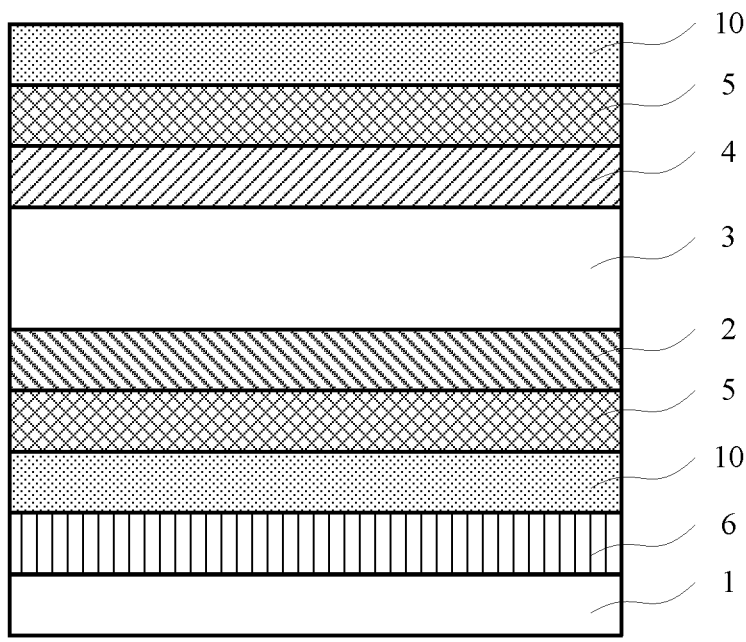
FIG. 3 is a schematic structural view 3 of the OLED element provided by the embodiment of the present invention.

Third mode: as illustrated in FIG. 3, the thermal expansion layer 5 is respectively disposed on a side of the anode 2 away from the organic functional layer 3 and a side of the cathode 4 away from the organic functional layer 3; the thermal expansion layer 5 disposed on the side of the anode 2 away from the organic functional layer 3 makes contact with the anode 2; and the thermal expansion layer 5 disposed on the side of the cathode 4 away from the organic functional layer 3 makes contact with the cathode 4. For instance, the OLED element comprises: a base substrate 1 and a reflective layer 6, a thermal expansion layer 5, an anode 2, an organic functional layer 3, a cathode 4 and a thermal expansion layer 5 which are sequentially stacked on the base substrate 1. When the OLED element works, the thermal expansion layer 5 beneath the anode 2 and the thermal expansion layer 5 on the cathode 4 respectively absorb heat produced by the organic functional layer 3, and/or, the thermal expansion layers 5 absorb heat applied to the thermal expansion layers 5 by external world, so that the temperature of the two thermal expansion layers 5 is changed, and hence the thickness of the two thermal expansion layers 5 is correspondingly changed according to the variation of respective temperature. Thus, the wavelength of light running through the thermal expansion layers 5 respectively is adjusted, so that the wavelength of the light emitted by the OLED element is adjusted, and hence the light color of the OLED element is adjusted, and consequently the display effect of the display device can be improved.

In the bottom-emission OLED element, the setting mode of the thermal expansion layer 5 includes but not limited to the following mode.

Figure 4:
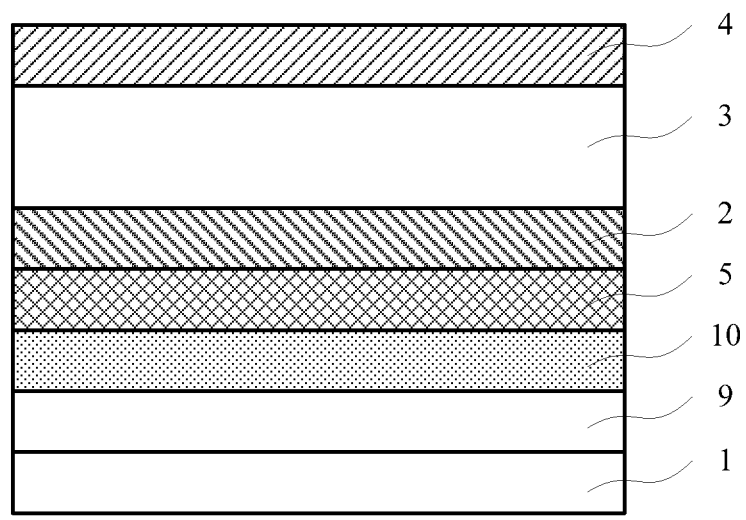
FIG. 4 is a schematic structural view 4 of the OLED element provided by the embodiment of the present invention.

Fourth mode: as illustrated in FIG. 4, the thermal expansion layer 5 is disposed between the anode 2 and the base substrate 1 and makes contact with the anode 2. That is to say, a thermal expansion layer 5, an anode 2, an organic functional layer 3 and a cathode 4 are sequentially stacked on a base substrate 1; the base substrate 1 is a transparent base substrate, e.g., a glass base substrate; the anode 2 may be an ITO anode; and the cathode 4 may be a metal cathode. When the OLED element works, a part of light emitted by the organic functional layer 3 is incident into the thermal expansion layer 5 through the anode 2, runs through the thermal expansion layer 5, and is emitted out of the OLED element from the base substrate 1, and the other part of light is reflected on the cathode 4, is incident into the thermal expansion layer 5 through the anode 2, runs through the thermal expansion layer 5, and is emitted out of the OLED element from the base substrate 1. When the OLED operates, heat produced by the organic functional layer 3 is conducted to the thermal expansion layer 5 through the anode 2, and/or, the thermal expansion layer 5 absorbs heat applied to the thermal expansion layer 5 by external world, so that the temperature of the thermal expansion layer 5 is changed, and hence the thickness of the thermal expansion layer 5 is also changed. Thus, the time of the light emitted by the organic functional layer 3 running through the thermal expansion layer 5 is adjusted, so that the wavelength of the light after running through the thermal expansion layer 5 is adjusted, and hence the wavelength of the light emitted by the OLED element is adjusted, and consequently the light color of the OLED element is adjusted.

As illustrated in FIG. 4, the OLED element further comprises a transflective layer 9 disposed between the anode 2 and the base substrate 1, and the thermal expansion layer 5 is disposed between the transflective layer 9 and the anode 2. For instance, the OLED element comprises a base substrate 1, a transflective layer 9, a thermal expansion layer 5, an anode 2, an organic functional layer 3 and a cathode 4, wherein the transflective layer 9, the thermal expansion layer 5, the anode 2, the organic functional layer 3 and the cathode 4 are sequentially stacked on the base substrate 1. When the OLED element works, a part of light running through the thermal expansion layer 5 runs through the transflective layer 9 and is emitted out of the OLED element from the base substrate 1, and the other part of light is reflected on the transflective layer 9, sequentially runs through the thermal expansion layer 5, the anode 2 and the organic functional layer 3, is reflected on the cathode 4, subsequently sequentially runs through the organic functional layer 3, the anode 2 and the thermal expansion layer 5, and is incident into the transflective layer 9. The above transmission process is repeated, so that the wavelength of the light emitted by the organic functional layer 3 is adjusted for a plurality of times, and hence the light color of the OLED element is adjusted. Thus, the wavelength and the light color of the light emitted by OLED elements in a display device are matched with each other, and hence the display effect of the display device can be improved.

In order to further adjust the thickness of the thermal expansion layer 5, as illustrated in FIGS. 1 to 4, the OLED element further comprises an electrothermal layer 10 connected with an external circuit. The electrothermal layer 10 is disposed on a side of the thermal expansion layer 5 away from the organic functional layer 3, makes contact with the thermal expansion layer 5, and is a transparent electrothermal layer.

For example, when the OLED element is a top-emission OLED element, as illustrated in FIG. 1, the thermal expansion layer 5 is disposed between the base substrate 1 and the anode 2 and makes contact with the thermal expansion layer 5, and the electrothermal layer 10 may be disposed between the thermal expansion layer 5 and the base substrate 1 and makes contact with the thermal expansion layer 5. As illustrated in FIG. 2, the thermal expansion layer 5 is disposed on a side of the cathode 4 away from the organic functional layer 3 and makes contact with the cathode 4, and the electrothermal layer 10 is disposed on a side of the thermal expansion layer 5 away from the organic functional layer 3 and makes contact with the thermal expansion layer 5. As illustrated in FIG. 3, the thermal expansion layer 5 is respectively disposed beneath the anode 2 and on the cathode 4; the thermal expansion layer 5 on the upper part in FIG. 3 makes contact with the cathode 4, and the thermal expansion layer 5 on the lower part in FIG. 3 makes contact with the anode 2; and the electrothermal layer 10 is respectively disposed on the thermal expansion layer 5 on the upper part in FIG. 3 and beneath the thermal expansion layer 5 on the lower part in FIG. 3 and respectively makes contact with corresponding thermal expansion layer 5.

When the OLED element is a bottom-emission OLED element, as illustrated in FIG. 4, the thermal expansion layer 5 is disposed between the base substrate 1 and the anode 2 and makes contact with the anode 2, and the electrothermal layer 10 may be disposed between the thermal expansion layer 5 and the base substrate 1 and makes contact with the thermal expansion layer 5.

When the OLED element works, power is supplied to the electrothermal layer 10 through the external circuit, and heat is gradually emitted by the electrothermal layer 10 and transmitted to the thermal expansion layer 5, so that the temperature of the thermal expansion layer 5 is gradually raised, and hence the thickness of the thermal expansion layer 5 is changed. Thus, the wavelength of the light emitted by the organic functional layer 3 running through the thermal expansion layer 5 is adjusted, so that the wavelength of the light emitted by the OLED element is adjusted, and hence the light color of the OLED element is adjusted. Therefore, the light color of OLED elements in a display device is matched with each other, and hence the display effect of the OLED element is further improved.

When the thickness of the thermal expansion layer 10 is not required to be continuous increased or the thickness of the thermal expansion layer 10 must be reduced, the connection between the external circuit and the electrothermal layer 10 may be cut off; the external circuit stops supplying power to the electrothermal layer 10; the electrothermal layer 10 may be taken as a heat dissipation layer; and the heat of the thermal expansion layer 5 is conducted to other layer structures of the OLED element or the outside of the OLED element, so that the temperature of the thermal expansion layer 5 is reduced, and hence the thickness of the thermal expansion layer 5 is reduced. As the thickness of the thermal expansion layer 5 can be adjusted, the light color of the OLED element can be adjusted.

In the embodiment, the thermal expansion layer 5 may be made from a plurality of materials. For instance, the thermal expansion layer 5 may be a mixed thermal expansion material thermal expansion layer formed of alkali silicate and polylol, e.g., mixed thermal expansion materials formed of sodium silicate and glycerol; or the thermal expansion layer 5 may be a zirconia-molybdenum gradient material thermal expansion layer formed of zirconia and molybdenum; or the thermal expansion layer 5 may be a negative thermal expansion (NTE) material thermal expansion layer, e.g., $Mn_3ZnN$ and $ZrW_2O_8$.

For instance, in the OLED element provided by the above embodiments, the thickness of the thermal expansion layer 5 can be changed due to the thermal expansion of the thermal expansion layer, so that the optical cavity length of the OLED element can be varied. Due to the variation of the optical cavity length, the wavelength of the light emitted by the OLED element can be adjusted to a certain degree.

The embodiment of the present invention further provides a display device, which comprises the OLED elements provided by the above embodiment.

The advantages of the display device are the same with those of the OLED element. No further description will be given here.

In the embodiment, the thermal expansion layer may be formed by a plurality of methods, e.g., vapor deposition method, spin-coating method, coating method or plasma enhanced chemical vapor deposition (PECVD) method.

In the description of the embodiment, the specific features, structures, materials or characteristics may be combined with each other by appropriate means in any one or more embodiments.

The foregoing is only the preferred embodiments of the present invention and not intended to limit the scope of protection of the present invention. The scope of protection of the present invention should be defined by the appended claims.

The application claims priority to the Chinese patent application No. 201610179872.8, filed Mar. 25, 2016, the disclosure of which is incorporated herein by reference as part of the application.

The invention claimed is:

1. An organic light-emitting diode (OLED) element, comprising a base substrate and an anode, an organic functional layer and a cathode sequentially stacked on the base substrate, wherein a thermal expansion layer is disposed on at least one of a side of the anode away from the organic functional layer or a side of the cathode away from the organic functional layer and is a transparent thermal expansion layer.

2. The OLED element according to claim 1, wherein the thermal expansion layer is disposed between the anode and base substrate and in contact with the anode.

3. The OLED element according to claim 2, wherein light emitted by the organic functional layer is emitted out of the OLED element through the cathode; the OLED element further comprises a reflective layer disposed between the anode and the base substrate; and the thermal expansion layer is disposed between the reflective layer and the anode.

4. The OLED element according to claim 3, wherein the OLED element further comprises a transparent protective layer which is disposed on the cathode.

5. The OLED element according to claim 2, wherein light emitted by the organic functional layer is emitted out of the OLED element through the anode; the OLED element further comprises a transflective layer disposed between the anode and the base substrate; and the thermal expansion layer is disposed between the transflective layer and the anode.

6. The OLED element according to claim 1, wherein light emitted by the organic functional layer is emitted out of the OLED element through the cathode; and the thermal expansion layer is disposed on a side of the cathode away from the organic functional layer and in contact with the cathode.

7. The OLED element according to claim 6, wherein the OLED element further comprises a reflective layer and a transition layer; the reflective layer is disposed between the anode and the base substrate; and the transition layer is disposed between the reflective layer and the base substrate and is in contact with the reflective layer and the base substrate, respectively.

8. The OLED element according to claim 1, wherein light emitted by the organic functional layer is emitted out of the OLED element through the cathode; the thermal expansion layer is respectively disposed on a side of the anode away from the organic functional layer and a side of the cathode away from the organic functional layer; the thermal expansion layer disposed on the side of the anode away from the organic functional layer is in contact with the anode; and the thermal expansion layer disposed on the side of the cathode way from the organic functional layer is in contact with the cathode.

9. The OLED element according to claim 1, wherein the OLED element further comprises an electrothermal layer capable of being connected with an external circuit; and the electrothermal layer is disposed on a side of the thermal expansion layer away from the organic functional layer, is in contact with the thermal expansion layer, and is a transparent electrothermal layer.

10. The OLED element according to claim 1, wherein the thermal expansion layer comprises at least one of the following:
a thermal expansion layer of a mixed thermal expansion material formed of alkali silicate and polylol;
a thermal expansion layer of a zirconia-molybdenum gradient material formed of zirconia and molybdenum; or
a thermal expansion layer of a negative thermal expansion material thermal.

11. A display device, comprising the OLED element according to claim 1.

12. The display device according to claim 11, wherein the thermal expansion layer is disposed between the anode and the base substrate and in contact with the anode.

13. The display device according to claim 12, wherein light emitted by the organic functional layer is emitted out of the OLED element through the cathode; the OLED element further comprises a reflective layer disposed between the anode and the base substrate; and the thermal expansion layer is disposed between the reflective layer and the anode.

14. The display device according to claim 13, wherein the OLED element further comprises a transparent protective layer which is disposed on the cathode.

15. The display device according to claim 12, wherein light emitted by the organic functional layer is emitted out of the OLED element through the anode; the OLED element further comprises a transflective layer disposed between the anode and the base substrate; and the thermal expansion layer is disposed between the transflective layer and the anode.

16. The display device according to claim 11, wherein light emitted by the organic functional layer is emitted out of the OLED element through the cathode; and the thermal expansion layer is disposed on a side of the cathode away from the organic functional layer and in contact with the cathode.

17. The display device according to claim 16, wherein the OLED element further comprises a reflective layer and a transition layer; the reflective layer is disposed between the anode and the base substrate; and the transition layer is disposed between the reflective layer and the base substrate and is in contact with the reflective layer and the base substrate, respectively.

18. The display device according to claim 11, wherein light emitted by the organic functional layer is emitted out of the OLED element through the cathode; the thermal expansion layer is respectively disposed on a side of the anode away from the organic functional layer and a side of the cathode away from the organic functional layer; the thermal expansion layer disposed on the side of the anode away from the organic functional layer is in contact with the anode; and the thermal expansion layer disposed on the side of the cathode way from the organic functional layer is in contact with the cathode.

19. The display device according to claim 11, wherein the OLED element further comprises an electrothermal layer capable of being connected with an external circuit; and the electrothermal layer is disposed on a side of the thermal expansion layer away from the organic functional layer, is in contact with the thermal expansion layer, and is a transparent electrothermal layer.

20. The display device according to claim 11, wherein the thermal expansion layer comprises at least one of the following:
- a thermal expansion layer of a mixed thermal expansion material formed of alkali silicate and polylol;
- a thermal expansion layer of a zirconia-molybdenum gradient material formed of zirconia and molybdenum; or
- a thermal expansion layer of a negative thermal expansion material thermal.

* * * * *